United States Patent [19]

Takashina

[11] Patent Number: 5,463,583
[45] Date of Patent: Oct. 31, 1995

[54] NON-VOLATILE SEMICONDUCTOR MEMORY DEVICE

[75] Inventor: Nobuaki Takashina, Kawasaki, Japan

[73] Assignee: Fujitsu Limited, Kawasaki, Japan

[21] Appl. No.: 180,798

[22] Filed: Jan. 10, 1994

Related U.S. Application Data

[63] Continuation of Ser. No. 970,649, Nov. 2, 1992, abandoned, which is a continuation of Ser. No. 545,790, Jun. 29, 1990, abandoned.

[30] Foreign Application Priority Data

Jun. 30, 1989 [JP] Japan ................... 1-168394

[51] Int. Cl.$^6$ .................................................. G11C 11/34
[52] U.S. Cl. ............................. 365/189.06; 365/230.06; 365/185.24
[58] Field of Search ........................... 365/185, 900, 365/104, 189.06, 226, 230.06

[56] References Cited

U.S. PATENT DOCUMENTS 4,527,256  7/1985  Gibbel ......................... 365/189.06

FOREIGN PATENT DOCUMENTS 0171718   2/1986   European Pat. Off. .
62-001192  1/1987   Japan .
62-114189  5/1987   Japan .

OTHER PUBLICATIONS

IEEE International Solid State Circuits Conference, vol. 1989, No. 32, Feb. 1989, New York, U.S., pp. 132–133, "A 5V–Only 256k Bit CMOS Flash EEPROM", by S. D'Arrigo et al.

Primary Examiner—Joseph A. Popek
Attorney, Agent, or Firm—Armstrong, Westerman, Hattori, McLeland and Naughton

[57] ABSTRACT

A non-volatile semiconductor memory device including a memory cell transistor connected to a bit line and having a floating gate and a control gate connected to a word line, a power source line for supplying a power source voltage, and selection unit for applying a word line selection voltage to the word line, wherein the word line selection voltage of the selection unit is lower than the power source voltage of the power source line.

4 Claims, 3 Drawing Sheets

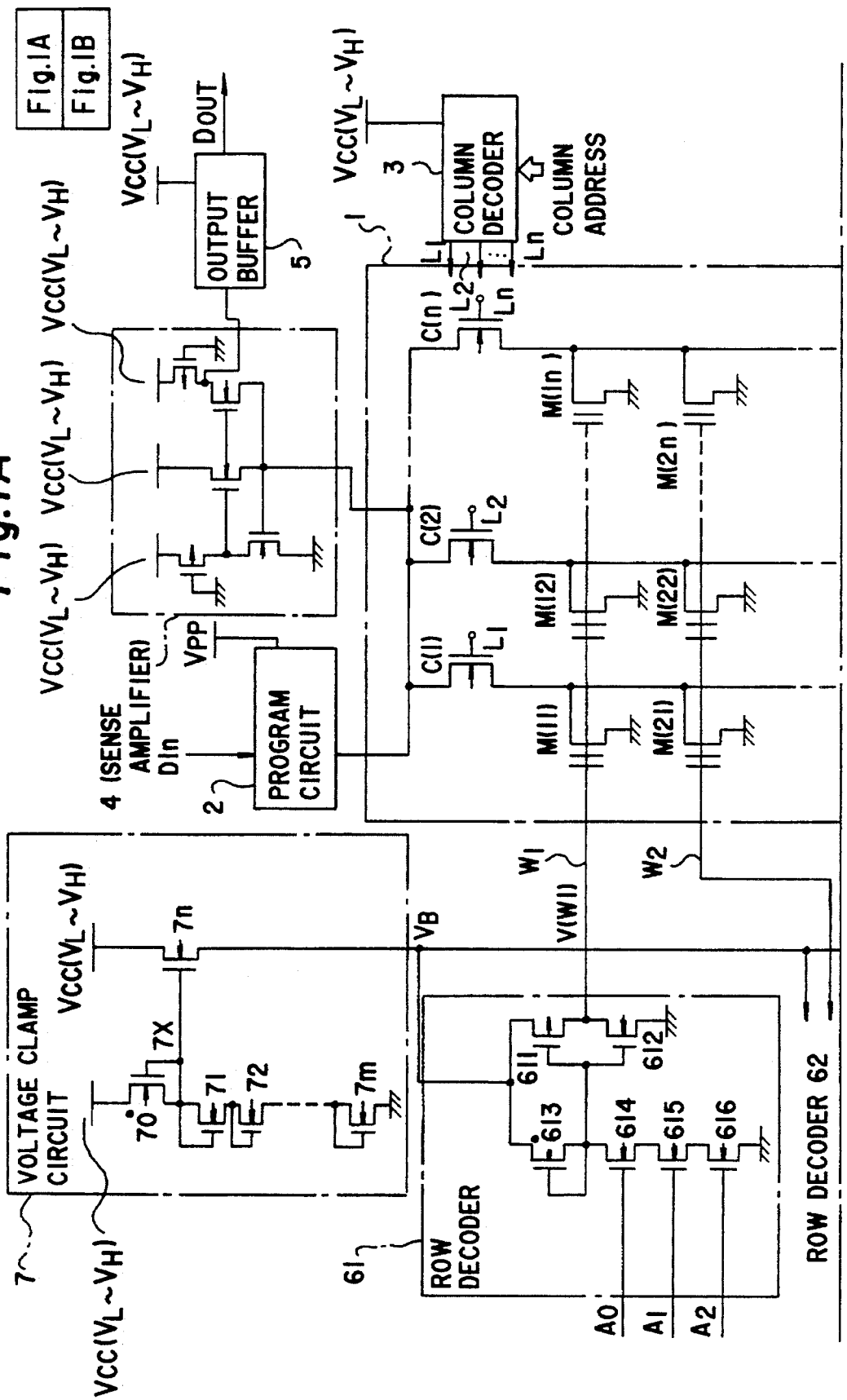

NON-VOLATILE SEMICONDUCTOR MEMORY DEVICE

This application is a Rule 62 continuation of application Ser. No. 07/970,644 filed Nov. 2, 1992, now abandoned, which is a continuation of application Ser. No. 07/545,790, filed Jun. 29, 1990, now abandoned.

BACKGROUND OF THE INVENTION

1. Field of the Invention

The present invention relates to a non-volatile semiconductor memory device. The device according to the present invention is applicable to an erasable programmable read only memory (EPROM).

2. Description of the Related Art

In general, in an EPROM having a floating gate, programming of data "0" or "1" is carried out by charging or discharging the floating gate of a memory cell transistor. A large or small value of the electrons accumulated in the floating gate of the memory cell transistor is revealed as a large or small threshold value of the memory cell transistor. Therefore, it is possible to read data "0" or " 1" of the memory cell by detecting whether the current flowing in response to an application of control gate voltage is small or large.

However, the electrons of the floating gate of the memory cell transistor tends to decrease with a lapse of time, and the threshold value of the memory cell transistor having a charged floating gate tends to approach that of a memory cell transistor having a discharged floating gate. Thus, the current reading of a memory cell transistor for data "0" is increased to approach the case for a memory cell transistor for data "1", and, as a result, an erroneous decision on the state of the memory cell transistor as data not being programmed may occur. This undesirably deteriorates the reliability of the system using an EPROM.

SUMMARY OF THE INVENTION

It is an object of the present invention to provide an improved non-volatile semiconductor memory device in which a reading of data stored in a memory cell transistor can be correctly carried out even if the threshold value of the memory cell transistor is considerably lowered after a lapse of time.

In accordance with the present invention, there is provided a non-volatile semiconductor memory device including:

a word line;

a bit line;

a memory cell transistor connected to said bit line and having a floating gate and a control gate connected to said word line;

a power source line for supplying a power source voltage; and selection unit for applying a word line selection voltage to the word line, wherein the word line selection voltage of the selection unit is lower than the power source voltage of the power source line.

BRIEF DESCRIPTION OF THE DRAWINGS

FIGS. 1A and 1B are schematic diagrams of a memory device according to an embodiment of the present invention.

DESCRIPTION OF THE PREFERRED EMBODIMENTS

Figure 1B:
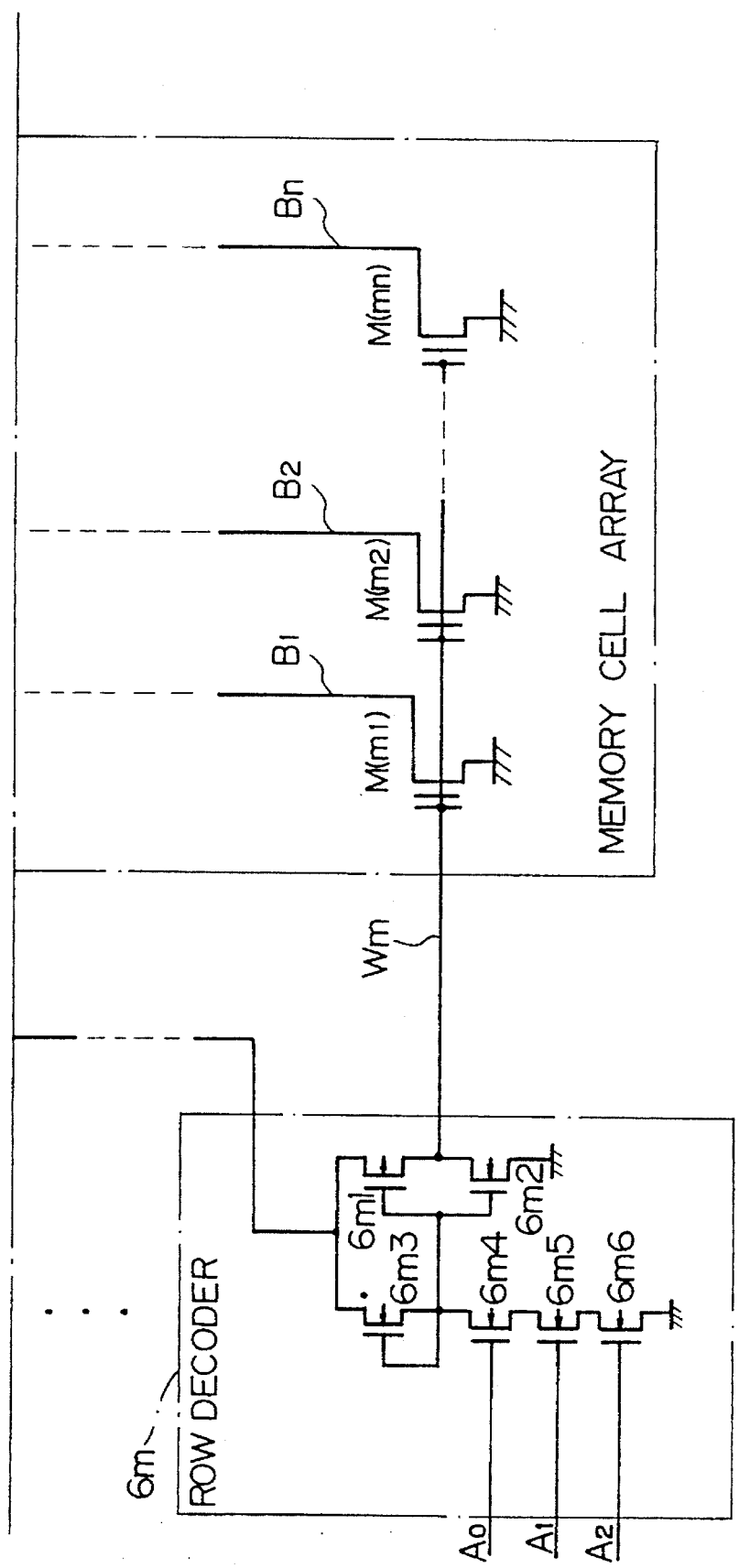
Figure 2:
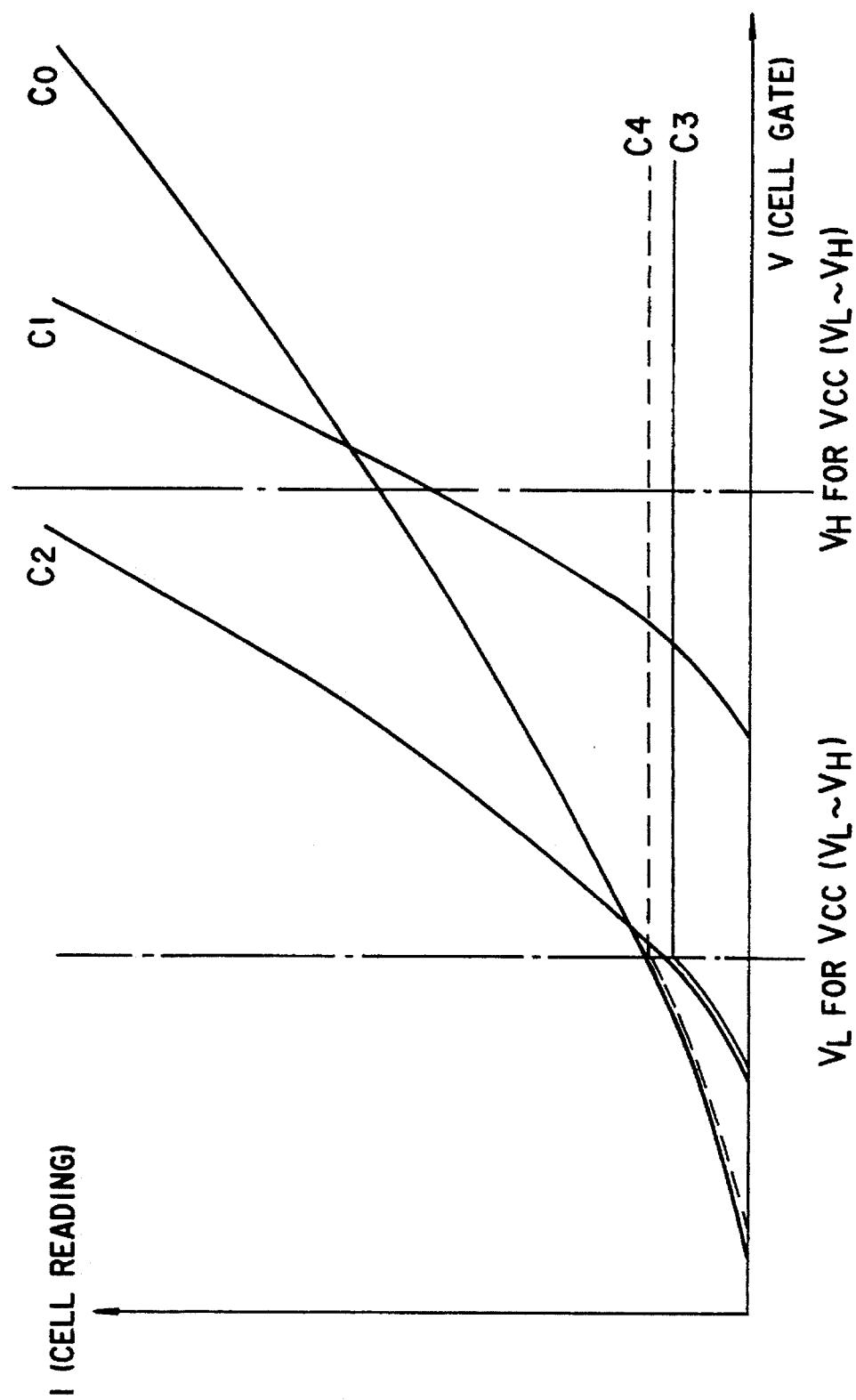
FIG. 2 is a digrams showing control gate voltage of the memory cell transistor versus drain-source of the memory cell transistor for illustrating the characteristics of the operation of the device of FIG. 1.

A non-volatile semiconductor memory device according to an embodiment of the present invention is shown in FIGS. 1A and 1B. A drain-source current versus control gate voltage of the memory cell transistor representing a characteristic of operation of the of FIGS. 1A and 1B are illustrated in FIG. 2.

The memory device of FIGS. 1A and 1B are comprised of a memory cell array 1 including FAMOS memory cell transistors M(11) to M(mn), a program circuit 2 for supplying a higher programming voltage $V_{pp}$ to the memory cell transistor of the memory cell array 1 in accordance with an input data Din, a column decoder 3, a sense amplifier 4, an output buffer 5, a sequence of row decoders 61, 62, . . . 6n, and a voltage clamp circuit 7.

The memory cell array 1 is constituted by a matrix-arranged plurality of memory cells M(11), M(12), . . . M(1n), M(21), M(22), . . . M(2n), . . . M(m1), M(m2), . . . M(mn), a sequence of column gates C(1), C(2), . . . C(n), a sequence of word lines $W_1$, $W_2$, . . . $W_m$, and a sequence of bit lines $B_1$, $B_2$, . . . $B_n$. The column gates C(1), C(2), . . . C(n) carry out bit line selection under the column selection signals $l_1$ to $l_n$ of the column decoder 3. The row decoders 61, 62, . . . 6m carry out word line selection in accordance with the address bits $A_0$, $A_1$, $A_2$.

The combination of the address bits $A_0$, $A_1$, $A_2$ and the inverted address bits $\overline{A}_0$, $\overline{A}_1$, $\overline{A}_2$ from an address buffer (not shown) are supplied to the row decoder.

The row decoder 61 is constituted by a CMOS inverter including a P channel enhancement MOS transistor 611 and an N channel enhancement MOS transistor 612, a sequence of N channel enhancement MOS transistors 614, 615, and 616, and N channel depletion MOS transistor 613.

It is assumed that a word line to which a memory cell transistor is connected is selected to become a HIGH potential state. When data is programmed into a memory cell transistor to render the threshold voltage to be high, this memory cell transistor is in an OFF state representing the data "0". When no data is programmed into a memory cell transistor to render the threshold voltage to be low, this memory cell transistor is in an ON state representing the data "1".

When a memory cell transistor is in an OFF state, no current flows through a sequence of the sense amplifier 4, the selected one of the column gates, the selected one of the bit lines, and a memory cell transistor, and the sense amplifier 4 detects the absence of current to deliver a cell read data D(OUT) to the output buffer 5. Thus, the reading of the data of the memory cell transistor is carried out.

The supply voltage $V_B$ for each of the row decoders 61, 62, . . . 6m is supplied from the power source voltage $V_{cc}$ through the voltage clamp circuit 7. The voltage V (W) of a word line W which is selected during a data read period is made lower than the supply voltage $V_{cc}$. Thus, the voltage V (W) of a word line W, namely the control gate voltage, which is selected during a data period is clamped to the value $V_L$. The voltage $V_L$ is the lowest power source voltage to ensure the normal operation of the device.

The voltage clamp circuit 7 has a depletion type N channel MOS transistor 70 having the gate short-circuited with the source, and enhancement type N channel MOS transistors 71, 72, . . . 7m each having the gate short-circuited with the drain. The threshold voltage, as the forward direction voltage of each of the transistors 71, 72, . . . 7m is assumed to be V(TH1). Accordingly, the voltage $V_x$ at node 7x is mV(TH1). This voltage mV(TH1) is supplied to the gate of enhancement type N channel MOS transistor 7n.

Accordingly, the potential $V_B$ of the source of the transistor 7n is a potential $V_x$ at node 7x minus the threshold voltage V(TH2) of the transistor 7n which is approximately equal to (m−1)V(TH2), since V(TH1) is approximately equal to V(TH2). Thus, the supply voltage $V_B$ for each of the row decoders 61, 62, . . . 6m is as follows.

$$V_B \approx (m-1)V(TH2)$$

The variation of the potential at node 7x is small, since the transistors 71, 72, . . . 7m are driven by the transistor 70 in a constant current manner. Accordingly, the variation of the supply voltage $V_B$ is also smaller than the power source voltage $V_{cc}$. Accordingly, the supply voltage $V_B$ which is lower than the power source voltage $V_{cc}$ is substantially a constant voltage not being subject to the influence of variation of the power source voltage $V_{cc}$.

Thus, the potential of a word line which is selected does not become higher than the supply voltage $V_B$ for the row decoder, even if the power source voltage $V_{cc}$ is raised. If the power source voltage $V_{cc}$ is lowered, the supply voltage $V_B$ for the row decoder will be lowered slightly but will not have a negative effect on the operation of the device.

The change with time of the written data is revealed in the manner of a decrease of the threshold value of the memory cell transistor. Under these circumstances, the clamped potential of a word line is selected to be the lowest voltage $V_L$ with which the operation of the device is satisfactorily ensured. If so selected, the written data can be correctly read, without being affected by a change with time, provided that the threshold value of the memory cell transistor does not become lower than the clamped potential.

In the characteristic curves in FIG. 2, the characteristic of cell gate voltage V(CELL GATE) versus cell reading current I(CELL READING) for a memory cell transistor without change with time of the memory cell is represented by $C_1$, and the same characteristic for a memory cell with change with time is represented by $C_2$. The curve $C_2$ is drawn in the manner of a leftward shifting of the curve $C_1$. The border line of the decision is represented by $C_0$. In the range over the curve $C_0$, no writing has been carried out into a memory cell and the stored data in the memory cell transistor is interpreted as "1", while in the range below the curve $C_0$, writing has been carried out into a memory cell transistor and the stored data in the memory cell transistor is interpreted as "0". It is assumed that the power source voltage $V_{cc}$ is varied between the maximum value $V_H$ and the lowest value $V_L$. In the range between $V_H$ and $V_L$, the curve $C_1$ is situated below the curve $C_0$, and accordingly the stored data is decided correctly as "0". However, after a change with time, the curve $C_1$ will be changed to $C_2$. Then, most parts of the curve $C_2$ are situated over the curve $C_0$, and only a minor part of curve $C_2$ close to $V_L$ is situated below the curve $C_0$ where the correct reading is carried out. In most of the parts, the stored data "0" is erroneously decided as "1".

Due to the voltage clamp circuit 7 in the device of FIG. 1, the curve $C_2$ is changed to the curve $C_3$.

As represented by the curve $C_3$, the supply voltage $V_B$ which corresponds to the voltage of the gate of a memory cell transistor connected with the selected word line is constant, even if the power source voltage $V_{cc}$ is increased in the range higher than the lowest voltage $V_L$. The curve $C_1$ without change with time would run along the abscissa.

As illustrated in the characteristic of FIG. 2, in the system of FIGS. 1A and 1B, the stored data "0" in the memory cell transistor can be always correctly decided as "0" in accordance with the curve $C_0$ for decision.

The broken line $C_4$ which may be regarded as a decision border line with a clamp is shown as a reference.

In the above described embodiment, the power source voltage of the row decoder is clamped. However, the similar effect is attained by providing a clamp circuit between a word line and ground.

As described above, in accordance with the present invention, the characteristic of data retention of an EROM is improved and it is possible to provide a device of a high reliability.

While the invention has been particularly shown and described in reference to preferred embodiments thereof, it will be understood by those skilled in the art that changes in form and details may be made therein without departing from the spirit and scope of the invention.

I claim:

1. A non-volatile semiconductor memory device comprising:

word lines;

bit lines;

memory cell transistors located at intersections of said word lines and said bit lines, connected to said bit lines, and having floating gates and control gates connected to said word lines;

a power source line for supplying a power source voltage; and selection means for applying a word line selection voltage to select a word line, wherein, during a reading of data from the memory cell transistor, the word line selection voltage lower than the power source voltage is applied to the word line, and wherein data written in the memory cell transistor is correctly read even if a predetermined threshold voltage of the memory cell transistor is lowered after a lapse of time due to decrease of the electrons injected to the floating gate of the memory cell transistor.

2. A device according to claim 1, wherein said selection means comprising:

a row decoder having an output connected to said word line, inputs receiving address signals, and a power source node, and a clamp circuit, connected between said power source line and the power source node of the row decoder, for clamping a maximum voltage at the power source node so that the word line selection voltage is lower than the power source voltage.

3. A device according to claim 2, further comprising a sense amplifier; column gates connected between the sense amplifier and the bit lines; and a column decoder for controlling the column gates, the power source line being connected to power source nodes of the sense amplifier and the column decoder.

4. A device according to claim 1, wherein the word line selection voltage is substantially the lowest voltage by which the normal operation of the device is ensured.

* * * * *